(12) United States Patent
Jakschik et al.

(10) Patent No.: US 7,268,037 B2
(45) Date of Patent: Sep. 11, 2007

(54) METHOD FOR FABRICATING MICROCHIPS USING METAL OXIDE MASKS

(75) Inventors: Stefan Jakschik, Dresden (DE); Thomas Hecht, Dresden (DE); Uwe Schröder, Dresden (DE); Matthias Goldbach, Dresden (DE)

(73) Assignee: Infineon Technologies, AG, Neubiberg (DE)

( * ) Notice: Subject to any disclaimer, the term of this patent is extended or adjusted under 35 U.S.C. 154(b) by 0 days.

(21) Appl. No.: 11/040,091

(22) Filed: Jan. 24, 2005

(65) Prior Publication Data

US 2005/0181557 A1    Aug. 18, 2005

Related U.S. Application Data

(63) Continuation of application No. PCT/DE03/02378, filed on Jul. 15, 2003.

(30) Foreign Application Priority Data

Jul. 30, 2002    (DE) ................................ 102 34 734

(51) Int. Cl.
*H01L 21/8242*    (2006.01)

(52) U.S. Cl. ...................... 438/243; 438/241; 438/243; 438/249; 438/653; 438/687; 257/E21.141

(58) Field of Classification Search ................ 438/241, 438/243
See application file for complete search history.

(56) References Cited

U.S. PATENT DOCUMENTS

| | | | |
|---|---|---|---|
| 4,012,763 A | 3/1977 | Kosa et al. | |
| 4,157,269 A | 6/1979 | Ning et al. | |
| 4,958,206 A * | 9/1990 | Teng et al. | 257/305 |
| 5,523,590 A | 6/1996 | Ogihara et al. | |
| 6,025,245 A * | 2/2000 | Wei | 438/386 |
| 6,500,707 B2 * | 12/2002 | Schrems | 438/249 |
| 2001/0055846 A1 | 12/2001 | Lamprecht et al. | |
| 2002/0014647 A1 | 2/2002 | Gutsche et al. | |
| 2002/0187605 A1 * | 12/2002 | Gutsche et al. | 438/241 |
| 2002/0197823 A1 * | 12/2002 | Yoo et al. | 438/424 |

* cited by examiner

*Primary Examiner*—Michael Lebentritt
*Assistant Examiner*—Kyoung Lee
(74) *Attorney, Agent, or Firm*—Edell, Shapiro & Finnan, LLC

(57) ABSTRACT

A process for modifying sections of a semiconductor includes covering the sections to remain free of doping with a metal oxide, e.g., aluminum oxide. Then, the semiconductor is doped, for example, from the gas phase, in those sections that are not covered by the aluminum oxide. Finally, the aluminum oxide is selectively removed again, for example using hot phosphoric acid. Sections of the semiconductor surface which are formed from silicon, silicon oxide or silicon nitride remain in place on the wafer.

8 Claims, 3 Drawing Sheets

METHOD FOR FABRICATING MICROCHIPS USING METAL OXIDE MASKS

CROSS REFERENCE TO RELATED APPLICATIONS

This application is a continuation of PCT/DE03/002378, filed Jul. 15, 2003, and titled "Use Of Metal Oxide Masks For Treating Surfaces In The Production Of Microchips," which claims priority under 35 U.S.C. §119 to German Application No. DE 102 34 734.4, filed on Jul. 30, 2002, and titled "Use Of Metal Oxide Masks For Treating Surfaces In The Production Of Microchips," the entire contents of which are hereby incorporated by reference.

FIELD OF THE INVENTION

The invention relates to a process for treating sections of a surface.

BACKGROUND

Economic success in the semiconductor industry is significantly influenced by further reduction in the minimum feature size which can be produced on a microchip. Reducing the minimum feature size makes it possible to increase the integration density of the electronic components, such as transistors or capacitors on the microchip, and therefore to increase the computation speed of processors and to increase the storage capacity of memory modules. To keep the space required by the components on the chip surface small, in the case of capacitors the depth of the substrate is also exploited. First, a trench is introduced into the wafer. Then, a bottom electrode is produced, for example by those regions of the wafer which adjoin the wall of the trench being doped in order to increase the electrical conductivity. Next, a thin film of a dielectric is applied to the bottom electrode. Finally, the trench is filled with an electrically conductive material to obtain a counterelectrode. This electrode is also known as a top electrode. This arrangement of electrodes and dielectric results in a folded capacitor. For electrode surfaces of the same size, i.e., the same capacitance, it is possible to minimize the lateral extent of the capacitor on the chip surface. Capacitors of this type are also known as deep trench capacitors.

In memory chips, the charged or discharged state of the capacitor corresponds to the two binary states 0 and 1. To allow reliable determination of the charge state of the capacitor and therefore of the information bit stored in the capacitor, the latter needs a certain minimum capacitance. If the capacitance or, in the case of a partially discharged capacitor, the charge drops below this value, the signal disappears in the noise, i.e., the information about the charge state of the capacitor is lost. After writing, the capacitor is discharged by leakage currents which effect a charge compensation between the two electrodes of the capacitor. To prevent information from being lost as a result of the discharging of the capacitor, in the case of DRAMs, the charge state of the capacitor is checked at regular intervals and refreshed as required, i.e., a partially discharged capacitor is charged again until it is restored to its original state. However, there are technical limits imposed on these so-called refresh times, i.e., they cannot be shortened to any desired extent. During the period of the refresh time, therefore, the charge on the capacitor must decrease at most by an extent which is such that it is still possible to reliably determine the charge state. For a given leakage current, therefore, the capacitor has to have a certain minimum charge at the beginning of the refresh time, so that by the end of the refresh time the charge state is still sufficiently well above the noise to allow the information stored in the capacitor to be read out reliably. As the dimensions decrease, the leakage currents increase, since tunneling effects become increasingly important. In order to make it possible to ensure reliable storage of information as miniaturization continues, the capacitor has to have a sufficiently high capacitance. To maintain the desired high capacitance despite the decreasing feature size, a large number of solution approaches are being followed. For example, the surface of the electrodes is provided with a structure in order to make the surface area of the electrodes as large as possible as their length and width decrease. Furthermore, new types of materials are being used. For example, attempts are being made to replace the silicon dioxide which has previously been used as a dielectric by materials with a higher dielectric constant.

To achieve the highest possible capacitance with a given size of a capacitor, it has also been attempted to dope the region of the semiconductor which directly adjoins the dielectric as highly as possible to produce the highest possible charge density in the electrode in the immediate vicinity of the dielectric.

In memory chips, the capacitor is connected to a transistor, which can be used to control the charge state of the capacitor. In the case of deep trench capacitors, the transistor is generally arranged above the capacitor. To make it possible to achieve sufficient electrical insulation between capacitor and transistor, therefore, the top section of the trench, which is adjoined by the transistor, is not doped. Therefore, during the fabrication of deep trench capacitors, to produce the bottom electrode, the trench is filled with a solid form of the dopant, e.g. an arsenic glass, only up to the limit within which the walls of the trench are to be doped. For this purpose, the trench is first of all completely filled with the arsenic glass, and then the filling is etched back to the limit up to which the semiconductor is to be doped. Then, the semiconductor substrate is heated, so that the dopant, for example arsenic ions, diffuse out of the arsenic glass into the semiconductor surrounding it on account of the thermal energy. At the start of the conditioning step, a relatively large quantity of arsenic ions diffuses into the semiconductor, with the number of arsenic ions in the arsenic glass being depleted continuously at the same time. Therefore, during the doping, a gradient is established for the transfer of the arsenic ions into the semiconductor, a maximum concentration of ions which migrate in being established at the start and the concentration of the ions which migrate in decreasing continuously as doping progresses on account of the depletion of the arsenic glass. As the conditioning continues, the arsenic ions diffuse further into the semiconductor, so that a maximum of the arsenic ion concentration is formed as a result of the depletion of the arsenic glass, this maximum gradually being displaced from the wall of the trench into the semiconductor. As a result, the maximum of the charge distribution in the electrode of the completed capacitor is also not arranged directly at the boundary between dielectric and semiconductor. Consequently, the capacitor acquires a lower capacitance than would be possible with a high level of doping at the interface between dielectric and semiconductor. Furthermore, on account of the reduction in the overall size of the capacitor, it is no longer possible for a sufficiently large quantity of arsenic glass to achieve a sufficiently high level of doping of those regions of the semiconductor which adjoin the trench wall to be made available in the interior of the trench.

In order to achieve a sufficiently high level of doping even with small dimensions of the trenches, the dopant can also be introduced into the semiconductor from the gas phase. Since there is always a sufficiently high concentration of the dopant available in the gas phase, a high level of doping of those sections of the semiconductor which form the bottom electrode in the finished capacitor is achieved, it being possible to set a high concentration of the dopant in particular at the interface between semiconductor and dielectric. However, this requires those regions of the semiconductor which are supposed to remain undoped to be covered with a diffusion barrier. Therefore, during the fabrication of deep-trench capacitors, a collar of silicon nitride is built up in the upper section of the trench and then acts as a diffusion barrier during the gas phase doping. For this purpose, the trench can, for example, first be partially filled with polysilicon. Then, a thin film of silicon nitride is deposited on the uncovered walls in the upper section of the trench. The polysilicon is then removed again from the lower section of the trench, so that the wall of the trench is uncovered again in the lower section. These sections, which correspond to the bottom electrode in the finished deep trench capacitor, can then be doped with a dopant from the gas phase. After the doping, the collar made from silicon nitride has to be removed again. However, the procedure needed to remove the silicon nitride collar is difficult. This is because, prior to the processing of a silicon wafer, the top side of the wafer is covered with a thin film of silicon nitride. This imparts a high chemical and mechanical stability to the wafer surface. In the case of chemical mechanical planarization, for example, the top side of the wafer is not removed, so that a planar surface is obtained. During the removal of the silicon nitride collar following the gas phase doping, therefore, the process conditions have to be maintained very accurately. Otherwise, overetching would occur, in which the silicon nitride layer deposited on the surface of the silicon wafer is also removed.

Difficulties with the removal of a temporary protective layer are not only encountered in the example of the fabrication of a deep trench capacitor cited above. For example, it is very difficult to selectively remove sections made from silicon nitride, silicon dioxide or silicon if at least two of these materials are arranged on the surface of a wafer. This constitutes a significant obstacle to the fabrication of large scale integrated electronic components.

SUMMARY OF THE INVENTION

The invention relates to a process for treating sections of a surface in which first sections on the surface are covered with a metal oxide and second sections in which the surface is uncovered are obtained, and the uncovered surface in the second sections is modified, which thereby allows simplified fabrication of large scale integrated electronic components.

In the process according to the invention, to treat the surface, a mask composed of metal oxides is applied. Compared to silicon nitride, even at low layer thicknesses metal oxides have a high efficiency as a diffusion barrier. The mask can therefore be designed to be very thin. This is advantageous in particular during the treatment of reliefs which comprise structures with a high aspect ratio. To fabricate deep trench capacitors which take up little space on the surface of the chip, trenches are introduced into the semiconductor substrate with a high aspect ratio. Therefore, at the top side of the wafer, the trenches have an opening of only a very small diameter. With the process according to the invention, even a small layer thickness of metal oxide is sufficient to suppress diffusion of the dopant into the semiconductor. Therefore, the opening of the trench is not excessively narrowed, and consequently, during gas phase doping, a sufficiently large quantity of the dopant can diffuse into the lower sections of the trench. In this way, a sufficient quantity of dopant to achieve a sufficient doping of the semiconductor in process times which are appropriate for industrial application can be introduced even into those sections of the trench which are arranged relatively deep inside the semiconductor.

In the process according to the invention, the metal oxide which serves as a mask during the modification of the second sections can remain on the surface after the modification of these sections and can be used, for example, as an insulator or dielectric in an electronic component which is to be built up on top.

In a particularly preferred embodiment of the process, however, the first sections formed from the metal oxide can also be selectively removed again. Metal oxides can be selectively removed next to silicon-containing compounds, such as silicon, silicon dioxide and silicon nitride, which are customarily used as dielectric or protective layers during the fabrication of microchips. This results in a higher degree of freedom in the configuration and fabrication of microelectronic components, such as transistors or capacitors, since it is possible for at least two materials to be used next to one another with the possibility of one of the materials, namely the metal oxide, being removed selectively adjacent to the other material. Examples of suitable materials which can be used next to the metal oxides are silicon, silicon dioxide and silicon nitride. Therefore, with the process according to the invention, it is possible, for example, to selectively produce sections on a semiconductor which are composed of silicon dioxide or silicon nitride. Then, in the sections which are uncovered after the removal of the metal oxide, it is possible to carry out a further treatment of the semiconductor. By way of example, the semiconductor can be patterned further in order to fabricate a transistor or electrically conductive connections to this transistor, the transistor being used to control the charge state of the capacitor.

The surface which is modified using the process according to the invention can inherently be selected as desired. The surface may, for example, be provided by a layer of silicon oxide or silicon nitride. This layer can initially be modified, for example etched, in the second sections, in which the silicon oxide or silicon nitride is uncovered. After the treatment, the metal oxide can be selectively removed, so that those sections of the layer of silicon oxide or silicon nitride which are arranged beneath the first sections are uncovered again. In this way it is possible, for example, to produce layer structures. However, the process according to the invention is particularly suitable for the treatment of a semiconductor substrate, for example a silicon wafer. The surface which is to be treated is then formed by the surface of the semiconductor substrate. The treatment may affect only the surface, or alternatively, the treatment may also be used to modify regions of the semiconductor substrate, which is preferably composed of silicon, which are close to the surface.

The process according to the invention is particularly advantageously used for the selective doping of the semiconductor. Metal oxides have a strong barrier action with respect to the diffusion of the dopant even in only small layer thicknesses. This makes it possible, for example including in trenches for deep trench capacitors which have a very small diameter, to achieve a reliable barrier action with respect to doping in the first sections covered by the metal oxide. In these sections, therefore, no doping occurs, whereas a high level of doping of the semiconductor is achieved in the second sections, in which the semiconductor is uncovered.

The doping may be carried out using conventional processes, for example, by the dopant being applied to the second sections in solid form in which the semiconductor is uncovered. This can be carried out, for example, by an arsenic glass being applied, as described above, and the semiconductor then being heated, so that the arsenic can diffuse out of the arsenic glass into the semiconductor in the second sections, which are not covered by the metal oxide. In the case of the doping of trenches for deep trench capacitors, there is no need to etch back the solid dopant, since the metal oxide protects those regions which are to remain free of the doping from diffusion of the dopant into these regions, such that a sharp doping profile is obtained. However, the doping is particularly advantageously carried out from the gas phase. As previously explained above, even in a small layer thickness, the metal oxides have a high barrier action with respect to the diffusion of a dopant, meaning that it is also possible to fabricate trench capacitors with a very small diameter. In the case of vapor phase doping, the dopant cannot readily penetrate into the lower, second sections of the trench and then effect a high level of doping of the semiconductor close to the surface. Therefore, for the same capacitance, it is possible to further reduce the dimensions of the deep trench capacitor, since a high charge density can be produced in the bottom electrode in the vicinity of the layer of the dielectric.

It is particularly preferable to carry out the doping using arsenic. If the doping is carried out in a solid phase, it is preferable to use an arsenic glass as source for the dopant. An example of a gaseous dopant which can be used is arsine. In addition to the abovementioned sources of the dopant arsenic, it is also possible to use other arsenic dopants which are known to the person skilled in the art.

Although it is preferable for the dopant used to be arsenic, it is also possible for the dopants used for the other elements which allow a sufficiently high number of charge carriers to be produced in the vicinity of the interface between bottom electrode and dielectric. For silicon semiconductors, for example, doping with phosphorus or boron is also suitable. The dopant should preferably be in the gaseous state.

The high barrier action of the metal oxide with respect to diffusion of substances into those sections of the semiconductor which are arranged beneath the metal oxide can also be utilized for the purpose of selectively oxidizing and/or nitriding the semiconductor in the second sections. For oxidation, by way of example, it is possible to use an oxygen gas. By way of example, nitrogen gas or nitrogen-containing compounds, such as ammonia, are suitable for nitriding.

A significant advantage of the process according to the invention lies in the possibility of selectively removing the metal oxide next to other materials. The metal oxide can be removed by dry-chemical means or alternatively by wet-chemical means. Hot phosphoric acid is particularly preferably used for the selective removal of metal oxides. Silicon and silicon dioxide are dissolved only in negligibly small quantities by hot phosphoric acid. In the case of silicon nitride, the etching rate is highly dependent on the temperature of the hot phosphoric acid. By selecting a suitable temperature, it is possible to set the etching rate in such a way that the metal oxide has already been removed while the silicon nitride remains substantially on the semiconductor surface. For this purpose, the temperature is selected appropriately in a range from 20° C. to 200° C., preferably 50° to 150° C.

In addition to hot phosphoric acid, it is also possible to use other etching media, although it is necessary to carefully adapt the etching conditions if sufficient selectivity of the etching operation is to be achieved. The etching conditions are then selected in such a way that the metal oxide is removed more quickly than, for example, silicon, silicon oxide or silicon nitride. An example of a suitable etching medium is dilute or concentrated hydrofluoric acid. Other etching media are also suitable.

The metal oxides which are used in the process according to the invention may inherently be derived from all metals which, in the periodic system, lie to the left of a diagonal dividing line starting at the element beryllium (second group) leading to polonium (sixteenth group). Therefore, oxides of the semimetals B, Si, Ge, As and Te do not form metal oxides in the context of the invention. It is particularly preferable to use metal oxides which have a high dielectric constant. The metal oxide layer can then be used further in microelectronic components as a dielectric.

It is particularly preferable to use metal oxides which comprise a metal selected from the group consisting of Al, Zr, Hf, Y, Pr, Zr, Ta, W, Ru, Ti, La, Nd, Nb. Aluminum oxide is particularly preferred among these metal oxides. Aluminum oxide can also be etched selectively next to silicon, silicon dioxide and silicon nitride following a heat treatment, for example using hot phosphoric acid.

The semiconductor used is preferably silicon. The semiconductor is preferably provided in the form of a wafer, in which case the wafer may also already have passed through processing steps and, by way of example, electronic components may already have been integrated in the wafer.

The process can be used in particular for the fabrication of bottom electrodes of deep trench capacitors. In this case, a trench is first introduced into the semiconductor, the trench having a wall which is partially covered with the metal oxide, so that first and second sections are obtained on the wall, the first sections being formed from the deposited metal oxide and the second sections corresponding to the regions of the wall in which the semiconductor is uncovered. The metal oxide is in this case generally applied as a collar in the upper region of the trench, i.e., adjacent to the opening of the trench at the surface of the semiconductor substrate. Then, by gas phase doping, the semiconductor can be selectively doped in the uncovered sections to produce a bottom electrode.

As previously mentioned, a barrier action to the diffusion of dopant can be achieved with metal oxides of even small layer thicknesses. The metal oxide is therefore preferably produced by an ALD (ALD=Atomic Layer Deposition) process. This process allows the deposition of individual atomic layers and therefore allows very accurate control of the layer thickness. This is particularly advantageous for the fabrication of trench capacitors which have a very small diameter or a very high aspect ratio. Examples of suitable precursors for the production of an aluminum oxide layer are aluminum alkyls, such as $Al(CH_3)_3$, $Al(CH_3)_2(C_2H_5)$ or $Al(t-C_4H_9)_3$ for aluminum and water, oxygen or ozone for oxygen.

The above and still further aspects, features, and advantages of the present invention will become apparent upon consideration of the following definitions, descriptions and descriptive figures of specific embodiments thereof wherein like reference numerals in the various figures are utilized to designate like components. While these descriptions go into specific details of the invention, it should be understood that variations may and do exist and would be apparent to those skilled in the art based on the descriptions herein.

BRIEF DESCRIPTION OF THE DRAWINGS

The invention is explained in more detail on the basis of an example and with reference to the appended figures, in which.

DETAILED DESCRIPTION

Figure 1A:
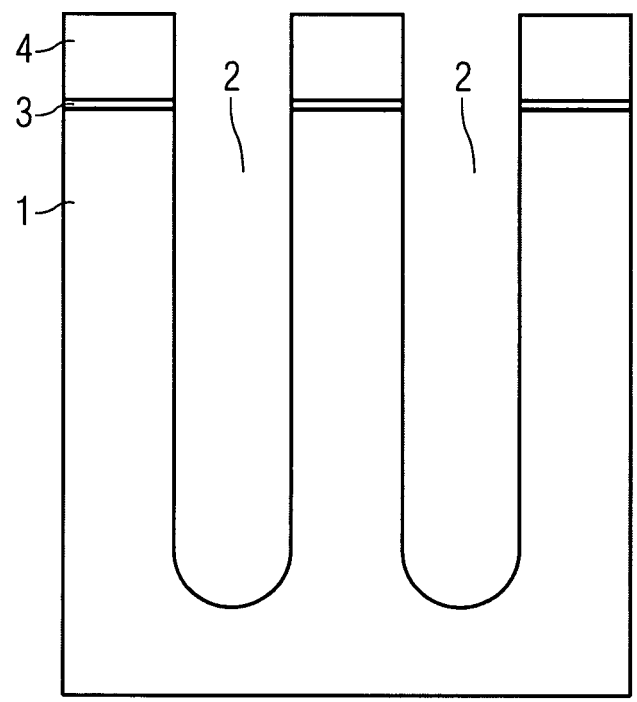
FIGS. 1A-1D show cross sections through a wafer perpendicular to the top side of the wafer, illustrating various stages in the fabrication of a deep trench capacitor.

FIG. 1A shows a section through a semiconductor 1, for example a silicon wafer, in which two trenches 2 have been formed. First, a thin oxide layer 3 is arranged on the top side of the semiconductor 1, and then a nitride layer 4 is arranged on top of this thin oxide layer 3. To produce the arrangement shown in FIG. 1A, a silicon wafer is first provided with a thin oxide layer 3 by thermal oxidation to reduce stresses in the wafer and to provide a bonding layer for further layers. Then, a CVD (Chemical Vapor Deposition) process is used to deposit an approximately 20 nm thick silicon nitride layer 4 on the oxide layer 3. Then, to pattern the nitride layer 4, a layer of a hard-mask material, for example a borosilicate glass, is deposited. Then, a photoresist is applied, exposed in sections with the aid of a photomask and developed using a developer to define openings with a diameter of approx. 100 nm for the trenches 2. The openings are then transferred into the layer of the hard mask using a fluorine plasma, with the corresponding regions of the nitride layer 4 being removed at the same time. After removal of the photoresist layer, the trenches 2 are etched into the silicon substrate 4 down to a depth of approximately 8 μm using a further fluorohydrocarbon plasma. Finally, the hard mask is removed, for example using hydrofluoric acid.

Figure 1B:
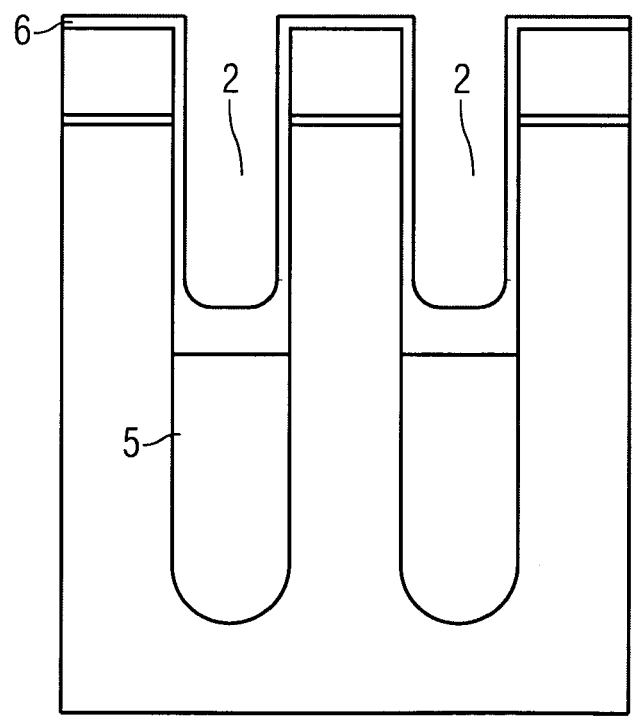

To obtain the structure shown in FIG. 1B, a thin, approximately 10 nm thick oxide layer is produced on the wall of the trenches 2 as a result of the uncovered silicon being thermally oxidized using oxygen. Then, polysilicon 5 is deposited on the wafer, so that the trenches 2 are completely filled with polysilicon. The polysilicon 5 is anisotropically etched back in order to remove the polysilicon again from the surface of the wafer and in the upper section of the trenches 2 down to a depth of approximately 1 μm. The uncovered oxide layer can be etched away again anisotropically at those sections of the trench wall which are uncovered in the upper region of the trenches 2. Then, an approximately 2-20 nm thick aluminum oxide layer 6 is deposited using an ALD process. Examples of suitable precursors for the ALD process are $Al(CH_3)_3$ and water. However, other precursors may also be used.

Figure 1C:
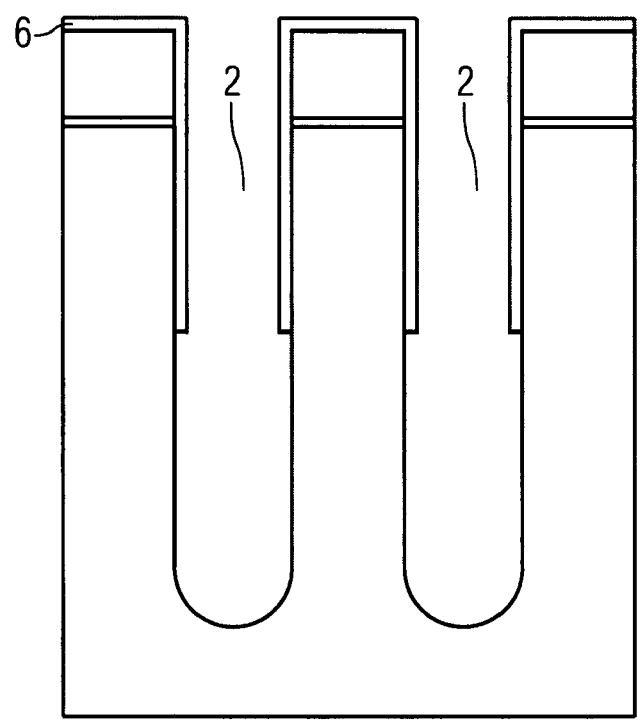
Figure 1D:
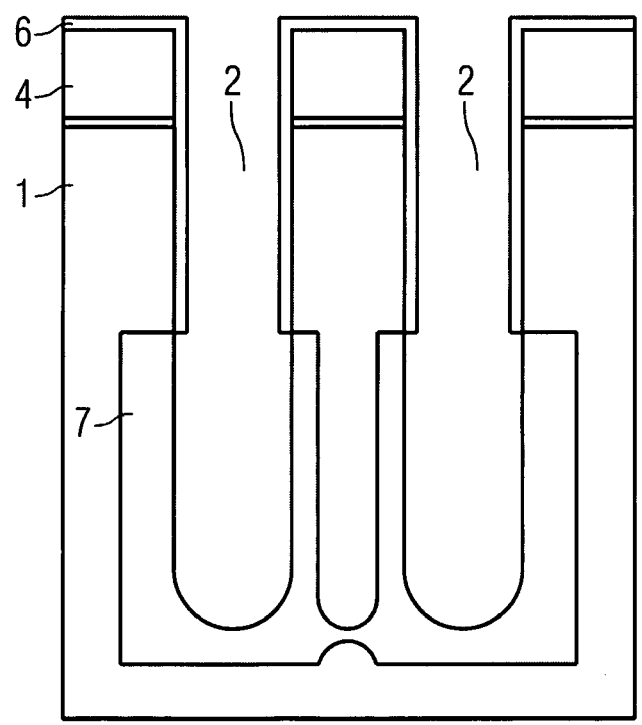

To enable the polysilicon 5 to be removed again from the trenches 2, the aluminum oxide layer 6 is etched anisotropically, so that aluminum oxide located on the polysilicon 5 is removed again. For this purpose, it is possible, by way of example, to use an anisotropic plasma ($C_4Ar$). The polysilicon which is still present in the trenches 5 is removed again by isotropic etching ($C_4Ar$), so that the trenches 2 are uncovered again down to their full depth. Finally, the thin oxide film produced beneath the polysilicon 5 at the wall of the trenches 2 is also removed by isotropic etching, for example using hydrofluoric acid. The result is the arrangement illustrated in FIG. 1C. In the upper section, the wall of the trenches 2 is covered with an aluminum oxide layer 6 in collar form, which acts as a diffusion barrier during the doping. The silicon at the wall of the trenches 2 is uncovered in the lower sections of the trenches 2.

During the gas phase doping, which is carried out, for example, using arsine, the dopant arsenic can then diffuse only into those regions of the semiconductor 1 which are not covered by the aluminum oxide layer 6. Adjacent to the lower section of the wall of the trenches 2, doped regions 7 which have a higher electrical conductivity and form the bottom electrode in the finished deep trench capacitor are obtained. Prior to the further treatment of the semiconductor substrate 1, it is possible for the aluminum oxide layer 6 to be selectively removed using hot phosphoric acid without the silicon in the trenches 2 or the silicon nitride layer 4 being removed. The capacitor is then completed in a known way.

EXAMPLE

An aluminum oxide layer with a thickness of 30 nm was deposited on a silicon wafer using a CVD (CVD=Chemical Vapor Deposition) process. After the deposition, in order to anneal crystal defects, the aluminum oxide layer was initially heated at 1000° C. for 20 s under nitrogen and was then heated at 850° C. for a further 4 min under an oxygen atmosphere. This was followed by heating at 1000° C. for a further 20 min in order to densify the aluminum oxide layer. The wafer prepared in this way was then doped with arsine from the gas phase for 30 minutes at 1 Torr and 950° C. Finally, a further thin layer of polysilicon for specimen preparation was applied to the wafer.

The wafer prepared in this way was examined using SIMS (Secondary Ion Mass Spectroscopy), so that a depth profile of the arsenic concentration was obtained.

Figure 2A:
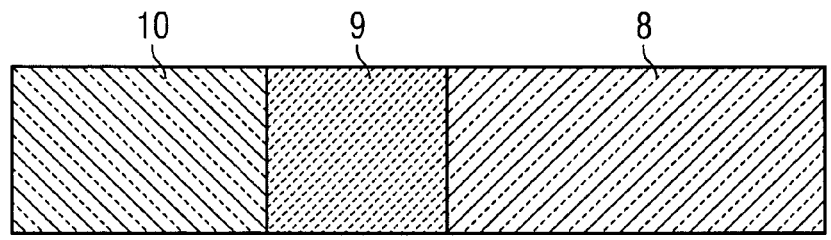
FIG. 2A diagrammatically depicts a section through a specimen substrate formed according to the process of the present invention.

FIG. 2A diagrammatically depicts a section through the specimen substrate described above. On the silicon wafer 8 there is a layer 9 of $Al_2O_3$, which as a diffusion barrier prevents arsenic from penetrating into the silicon wafer 8. For metrological reasons, a layer 10 of polysilicon is arranged on the layer 9.

Figure 2B:
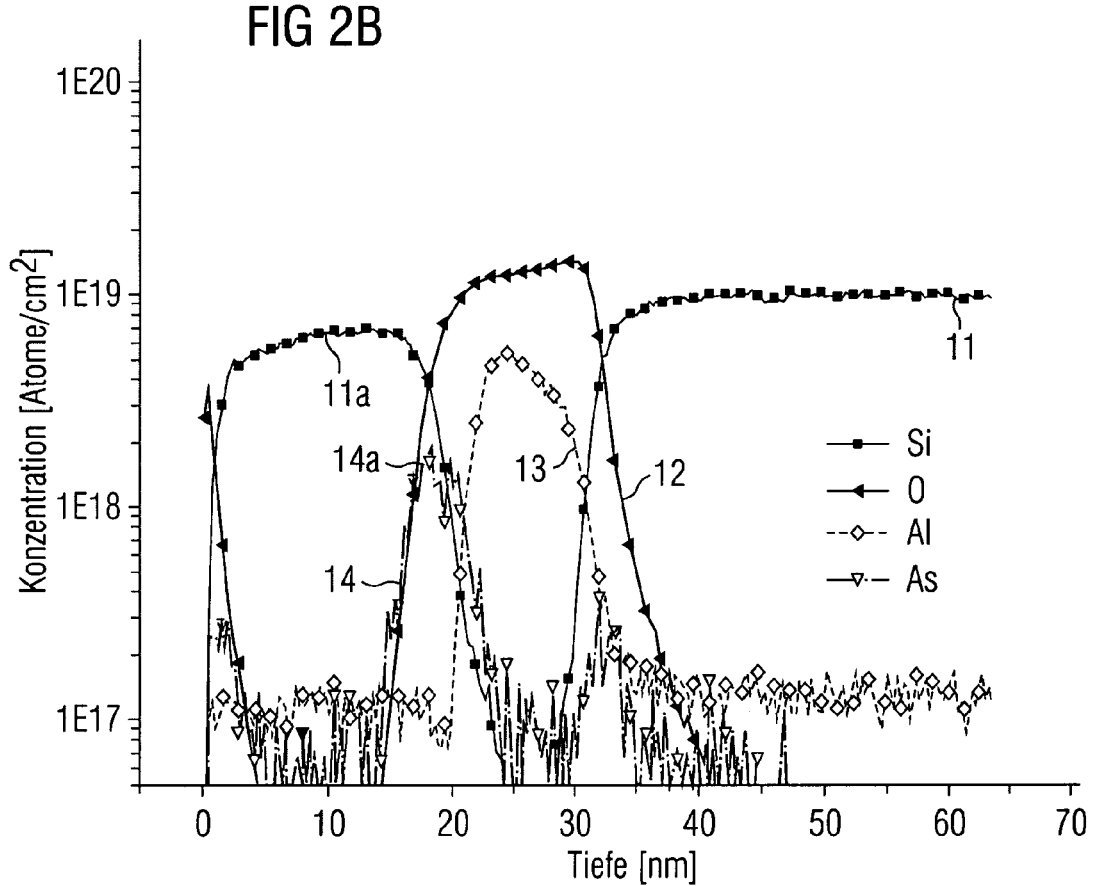
FIG. 2B shows an SIMS depth spectrum obtained with a silicon wafer doped using the process according to the invention, the spectrum being recorded in the sections covered with $Al_2O_3$.

FIG. 2B reproduces the spectrum measured by SIMS, the x axis (depth) corresponding to the size of the specimen substrate illustrated in FIG. 2A. The spectrum in each case illustrates the concentration of the silicon atoms (curve 11), oxygen atoms (curve 12), aluminum atoms (curve 13) and arsenic atoms (curve 14). During the removal of the layer 10 of polysilicon, a peak 11a is obtained, corresponding to a high silicon concentration, while the curves 12 to 14 remain at low values. After removal of the layer 10 of polysilicon, the curve 11 of the silicon concentration drops considerably, whereas the curve 14 illustrating the arsenic ion concentration rises steeply, forming a peak 14a. This peak is attributable to the deposition of arsenic atoms on the layer 9 of $Al_2O_3$ during the doping. During the removal of the layer 9 of $Al_2O_3$, the curve 12 illustrating the oxygen concentration and the curve 13 illustrating the aluminum concentration rise and form peaks 12a and 13a. The concentration of the arsenic atoms drops back to the starting value, i.e., the arsenic atoms substantially do not diffuse into the layer 9 of $Al_2O_3$. After removal of the layer 9 of $Al_2O_3$, the curves 12 and 13 drop back to the starting value, while the concentration of the silicon atoms increases again with the curve 11 returning to a maximum 11b. The concentration of the arsenic atoms (curve 14) remains at a low level, i.e., there has been no doping of the silicon wafer 8 with arsenic atoms.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

What is claimed is:

1. A method for fabricating a deep trench capacitor by treating sections of a surface of a trench, comprising:
    partially covering the surface of the trench with a metal oxide layer to obtain first sections of the surface, wherein the metal oxide layer comprises at least one metal that is selected from the group consisting of Al, Zr, Hf, Y, Pr, Ta, W, Ru, Ti, La, Nd and Nb;
    introducing a dopant into areas of the surface of the trench that are not covered by the metal oxide layer, such that the metal oxide layer acts as a diffusion barrier during doping; and
    selectively removing the first sections formed from the metal oxide, after introducing the dopant into the areas that are not covered by the metal oxide layer.

2. The method as claimed in claim 1, wherein the surface of the trench is formed by an area of a semiconductor substrate.

3. The method as claimed in claim 1, wherein the dopant is introduced from a gas phase and the surface of the trench is formed by an area of a semiconductor.

4. The method as claimed in claim 1, wherein the dopant comprises arsenic.

5. The method as claimed in claim 1, wherein the metal oxide layer includes aluminum oxide.

6. The method as claimed in claim 1, wherein the semiconductor substrate comprises silicon, an area of which forms a surface of a substrate.

7. The method as claimed in claim 1, wherein the metal oxide layer is applied to the surface of the trench using an atomic layer deposition process.

8. A method for fabricating a deep trench capacitor by treating sections of a surface of a trench, comprising:
    partially covering at least one surface of the trench with a metal oxide layer, wherein the metal oxide layer comprises at least one metal that is selected from the group consisting of Al, Zr, Hf, Y, Pr, Ta, W, Ru, Ti, La, Nd and Nb;
    introducing a dopant into areas of the surface of the trench that are not covered by the metal oxide layer, such that the metal oxide layer acts as a diffusion barrier during doping; and
    removing the metal oxide layer entirely from the at least one surface of the trench after introduction of the dopant into the areas that are not covered by the metal oxide layer.

* * * * *